(12) United States Patent
Hsu et al.

(10) Patent No.: US 10,530,038 B2
(45) Date of Patent: Jan. 7, 2020

(54) SEMICONDUCTOR PACKAGE DEVICE

(71) Applicant: Advanced Semiconductor Engineering, Inc., Kaohsiung (TW)

(72) Inventors: Shao-En Hsu, Kaohsiung (TW); Huei-Shyong Cho, Kaohsiung (TW); Shih-Wen Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 30 days.

(21) Appl. No.: 15/913,856

(22) Filed: Mar. 6, 2018

(65) Prior Publication Data

US 2019/0280367 A1   Sep. 12, 2019

(51) Int. Cl.
| | |
|---|---|
| *H01Q 1/22* | (2006.01) |
| *H01L 23/367* | (2006.01) |
| *H01L 23/498* | (2006.01) |
| *H01Q 1/02* | (2006.01) |
| *H01Q 1/24* | (2006.01) |
| *H01Q 21/06* | (2006.01) |
| *H01L 23/66* | (2006.01) |

(52) U.S. Cl.
CPC ....... *H01Q 1/2283* (2013.01); *H01L 23/3672* (2013.01); *H01L 23/49816* (2013.01); *H01L 23/49827* (2013.01); *H01L 23/66* (2013.01); *H01Q 1/02* (2013.01); *H01Q 1/243* (2013.01); *H01Q 21/065* (2013.01); *H01L 2223/6616* (2013.01); *H01L 2223/6677* (2013.01)

(58) Field of Classification Search
CPC ............ H01Q 1/2283; H01L 23/49816; H01L 23/49827; H01L 23/66; H01L 2223/6616; H01L 2223/6677; H01L 23/367–3677
See application file for complete search history.

(56) References Cited

U.S. PATENT DOCUMENTS

| | | | |
|---|---|---|---|
| 2009/0168367 A1* | 7/2009 | Fujii | H01L 23/3128 361/720 |
| 2016/0049723 A1* | 2/2016 | Baks | H01L 23/49827 343/848 |
| 2017/0062299 A1* | 3/2017 | Auchere | H01L 23/3135 |
| 2018/0254550 A1* | 9/2018 | Murata | H01Q 1/38 |
| 2018/0342470 A1* | 11/2018 | Liao | H01L 23/66 |
| 2019/0027449 A1* | 1/2019 | Wan | H01L 24/20 |

FOREIGN PATENT DOCUMENTS

EP   0 866 517 B1   7/2004

* cited by examiner

*Primary Examiner* — Scott B Geyer
(74) *Attorney, Agent, or Firm* — Foley & Lardner LLP; Cliff Z. Liu

(57) ABSTRACT

A semiconductor package device includes a substrate, an antenna and a conductor. The substrate has an upper surface. The antenna is disposed on the upper surface of the substrate. The conductor is disposed on the upper surface of the substrate and surrounds the antenna. The conductor has a first surface facing toward the antenna and a second surface opposite to the first surface. The second surface of the conductor is spaced apart from the upper surface of the substrate.

24 Claims, 13 Drawing Sheets

SEMICONDUCTOR PACKAGE DEVICE

BACKGROUND

1. Technical Field

The present disclosure relates to a semiconductor package device, and to a semiconductor package device including an antenna array.

2. Description of the Related Art

Wireless communication devices, such as cell phones, or vehicle radars, can include antennas for transmitting and receiving radio frequency (RF) signals. In some applications, the size of the antenna, transmission quality and the transmission distance can be important parameters for designing an antenna. With the continuous development of mobile communication and pressing demand for high data rate and stable communication quality, high frequency wireless transmission (e.g., at 28 GHz or at 60 GHz) can be important. It may be desirable to provide an antenna array with a larger gain and a better heat dissipation.

SUMMARY

In some aspects according to some embodiments, a semiconductor package device includes a substrate, an antenna and a conductor. The substrate has an upper surface. The antenna is disposed on the upper surface of the substrate. The conductor is disposed on the upper surface of the substrate and surrounds the antenna. The conductor has a first surface facing toward the antenna and a second surface opposite to the first surface. The second surface of the conductor is spaced apart from the upper surface of the substrate.

In some aspects according to some embodiments, a semiconductor package device includes a substrate, an antenna, a conductor and a connection element. The substrate has an upper surface and a lower surface opposite to the upper surface. The antenna is disposed on the upper surface of the substrate. The conductor is disposed on the upper surface of the substrate and surrounding the antenna. The connection element is disposed between the conductor and the upper surface of the substrate and connects the conductor to the upper surface of the substrate.

In some aspects according to some embodiments, a semiconductor package device includes a substrate, an antenna and a conductive frame. The substrate has an upper surface and a lower surface opposite to the upper surface. The antenna is disposed on the upper surface of the substrate. The conductive frame is disposed on the upper surface of the substrate and surrounds the antenna.

In some aspects according to some embodiments, a method of manufacturing a semiconductor package device includes providing a substrate including an upper surface; disposing an antenna on the upper surface of the substrate; and disposing a conductor on the upper surface of the substrate to surround the antenna.

Figure 1A:
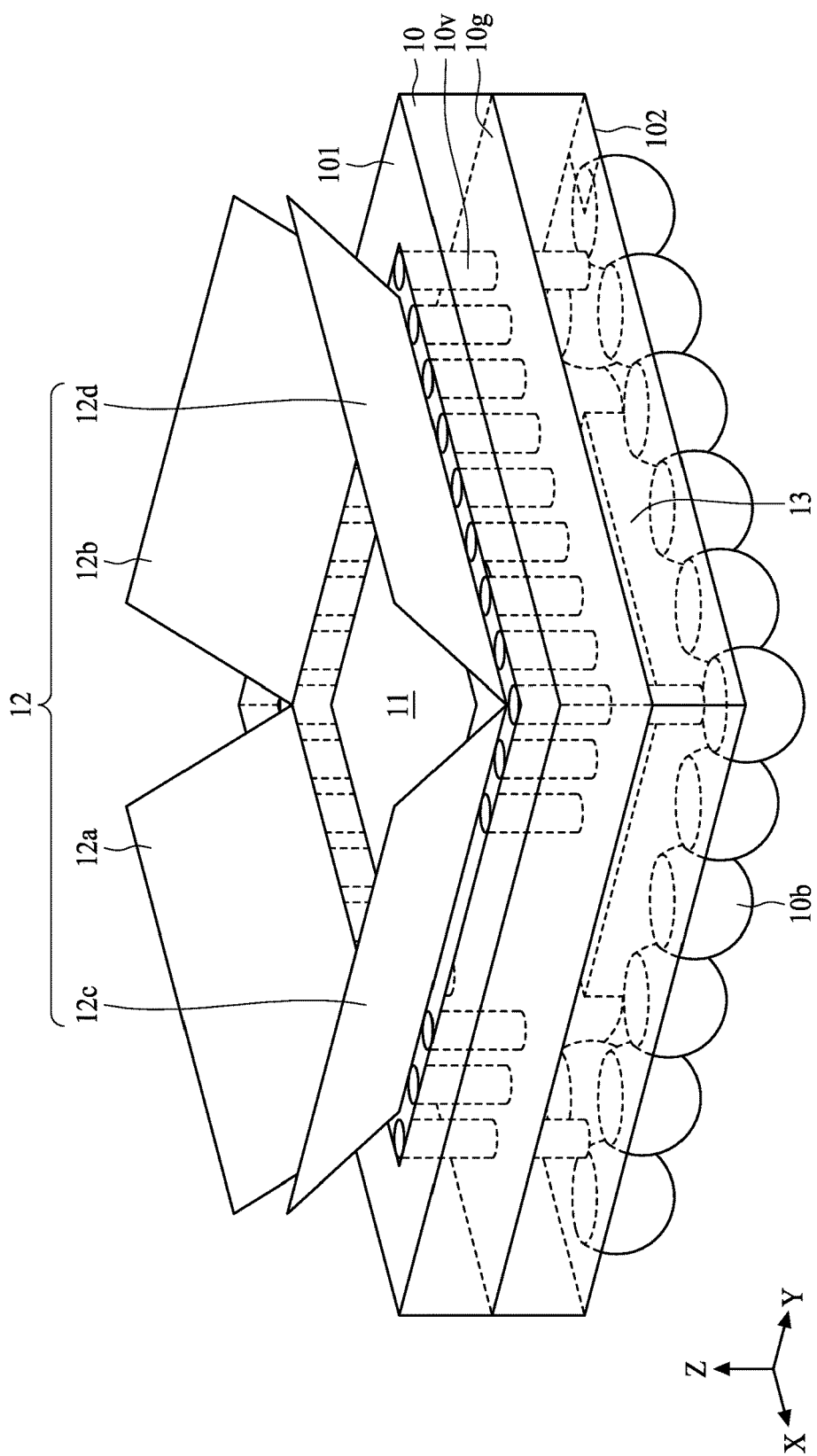
FIG. 1A illustrates a perspective view of a semiconductor package device in accordance with some embodiments of the present disclosure.

Common reference numerals are used throughout the drawings and the detailed description to indicate the same or similar components. The present disclosure can be readily understood from the following detailed description taken in conjunction with the accompanying drawings.

DETAILED DESCRIPTION

FIG. 1A illustrates a perspective view of a semiconductor package device 1 in accordance with some embodiments of the present disclosure. The semiconductor package device 1 includes a substrate 10, an antenna 11, a conductor 12 and an electronic component 13.

The substrate 10 may include, for example, a printed circuit board, such as a paper-based copper foil laminate, a composite copper foil laminate, or a polymer-impregnated glass-fiber-based copper foil laminate. The substrate 10 may include an interconnection structure (or electrical connection), such as a redistribution layer (RDL) or a grounding element. The substrate has a surface 101 and a surface 102 opposite to the surface 101. In some embodiments, the surface 101 of the substrate 10 is referred to as an upper surface or a first surface and the surface 102 of the substrate 10 is referred to as a lower surface or a second surface. In some embodiments, the substrate 10 may include multiple layers (e.g., metal layers), and the layers can be electrically connected through one or more interconnection structures 10v (e.g., vias). In some embodiments, the substrate 10 includes a ground layer 10g disposed between the surface 101 of the substrate 10 and the surface 102 of the substrate 10. In some embodiments, the surface 101 of the substrate 10 and the ground layer 10g of the substrate 10 are electrically connected through one or more of the interconnection structures 10v. In some embodiments, one or more of the interconnection structures 10v extend from the surface 101 of the substrate 10 to at least the ground layer 10g. In some embodiments, the substrate 10 may include electrical contacts 10b (e.g., solder bumps) on the surface 102 to provide electrical connections between the semiconductor package device 1 and other circuits or electrical devices.

The antenna 11 is disposed on the surface 101 of the substrate 10. In some embodiments, the antenna 11 includes a single antenna element. In some embodiments, the antenna 11 may include multiple antenna elements. For example, the antenna 11 may include an array including a patch antenna, a dipole antenna, a monopole antenna or the like. In some embodiments, the antenna 11 may include an M×N array of antenna elements, where M or N is an integer greater than 1. In some embodiments, M can be the same as or different from N depending on design specifications. For example, the antenna 11 may include a 4×4 array of antenna elements. For example, the antenna 11 may include a 4×1 array of antenna elements.

The conductor 12 is disposed on the surface 101 of the substrate 10. The conductor 12 may be referred to herein as a "conductive frame." The conductor 12 is adjacent to and disposed around the antenna 11. For example, the conductor 12 surrounds the antenna 11. For example, the conductor 12 is disposed at the periphery of the antenna 11. For example, the conductor 12 includes four sheets 12a, 12b, 12c and 12d, disposed at respective edges of the antenna 11. In some embodiments, there is gap between one or more pairs of adjacent sheets of the conductor 12. For example, there are respective gaps between the sheets 12a and 12b, the sheets 12b and 12d, the sheets 12d and 12c or the sheets 12c and 12a. In some embodiments, the gaps are located adjacent to respective corners of the antenna 11. In some embodiments, the conductor 12 includes one or more metals, metal alloys, or other conductive materials.

Figure 1B:
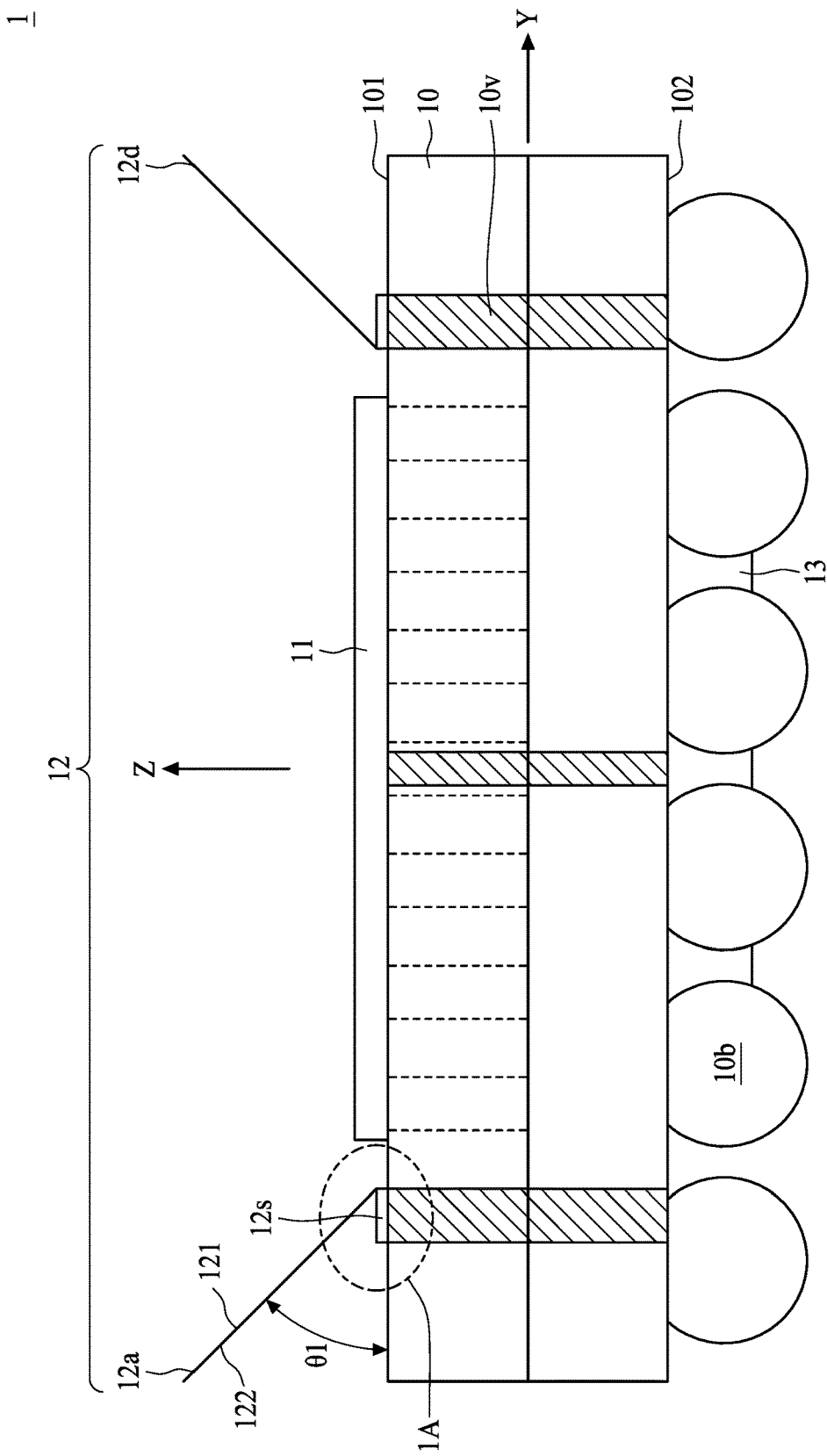
FIG. 1B illustrates a cross-sectional view of a semiconductor package device in accordance with some embodiments of the present disclosure.

As shown in FIG. 1B, which illustrates a cross-sectional view of the semiconductor package device 1 along the y-direction in FIG. 1A, each sheet of the conductor 12 has a surface 121 (also referred to as first surface) facing toward the antenna 11 (e.g. a surface 121 on an antenna side of the sheet of the conductor 12, which need not directly face the antenna 11) and a surface 122 (also referred to as second surface) opposite to the surface 121. In some embodiments, there is a distance between the surface 121 and the surface 122. For example, the sheet of the conductor 12 has a thickness. The surface 122 faces toward the surface 101 of the substrate 10, directly or indirectly, and is spaced apart from the surface 101 of the substrate 10. In some embodiments, the surface 121 of each sheet of the conductor 12 includes an electromagnetic-reflective surface. For example, the surface 121 can reflect one or more electromagnetic waves radiated by the antenna 11, so as to direct the electromagnetic waves in a predetermined direction (e.g., in the z-direction shown in FIG. 1A), which can increase the radiation efficiency (or the gain) of the antenna 11. In some embodiments, the surface 122 of each sheet of the conductor 12 includes a thermal dissipation surface, so as to increase the heat dissipation of the semiconductor package device 1. In some embodiments, a roughness of the surface 121 is different from a roughness of the surface 122. For example, the roughness of the surface 121 is less than the roughness of the surface 122 (e.g. the roughness of the surface 121 is about 0.9 or less, about 0.8 or less, or about 0.7 or less times the roughness of the surface 122). In some embodiments, as shown in FIG. 1B, an angle θ1 defined by the surface 101 of the substrate 10 and the surface 122 of the conductor 12 is greater than 0 degrees and is less than or equal to about 90 degrees, such as greater than 0 degrees and less than or equal to about 80 degrees.

In some embodiments, the conductor 12 is spaced apart from the surface 101 of the substrate 10 (e.g. does not directly contact the surface 101 of the substrate 10). The conductor 12 may include a first terminal that is adjacent to the surface 101 of the substrate 10, and a second terminal opposite to the first terminal. The first terminal may be electrically connected to an interconnection structure 10v, and/or may be electrically connected to a grounding element disposed in the substrate 10 that is exposed by the surface 101. There may be a distance between the surface 101 of the substrate 10 and the first terminal of the conductor 12 that is adjacent to the surface 101 of the substrate 10. For example, as shown in FIG. 1B, a connection member 12s (e.g., a soldering layer or an electrically conductive adhesive layer) is disposed between the conductor 12 and the surface 101 of the substrate 10. The connection member 12s connects the first terminal of the conductor 12 that is adjacent to the surface 101 of the substrate 10 to the substrate 10.

The electronic component 13 is disposed on the surface 102 of the substrate 10. In some embodiments, the electronic component 13 is electrically connected to the antenna 11 through the interconnection structure 10v (which can function as a feeding element) within the substrate 10. The electronic component 13 may include a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. The electronic component 13 may be electrically connected to the substrate 10 (e.g., to conductive pads of the substrate 10 or disposed on the substrate 10), and electrical connection may be attained by way of flip-chip or wire-bond techniques.

Figure 2A:
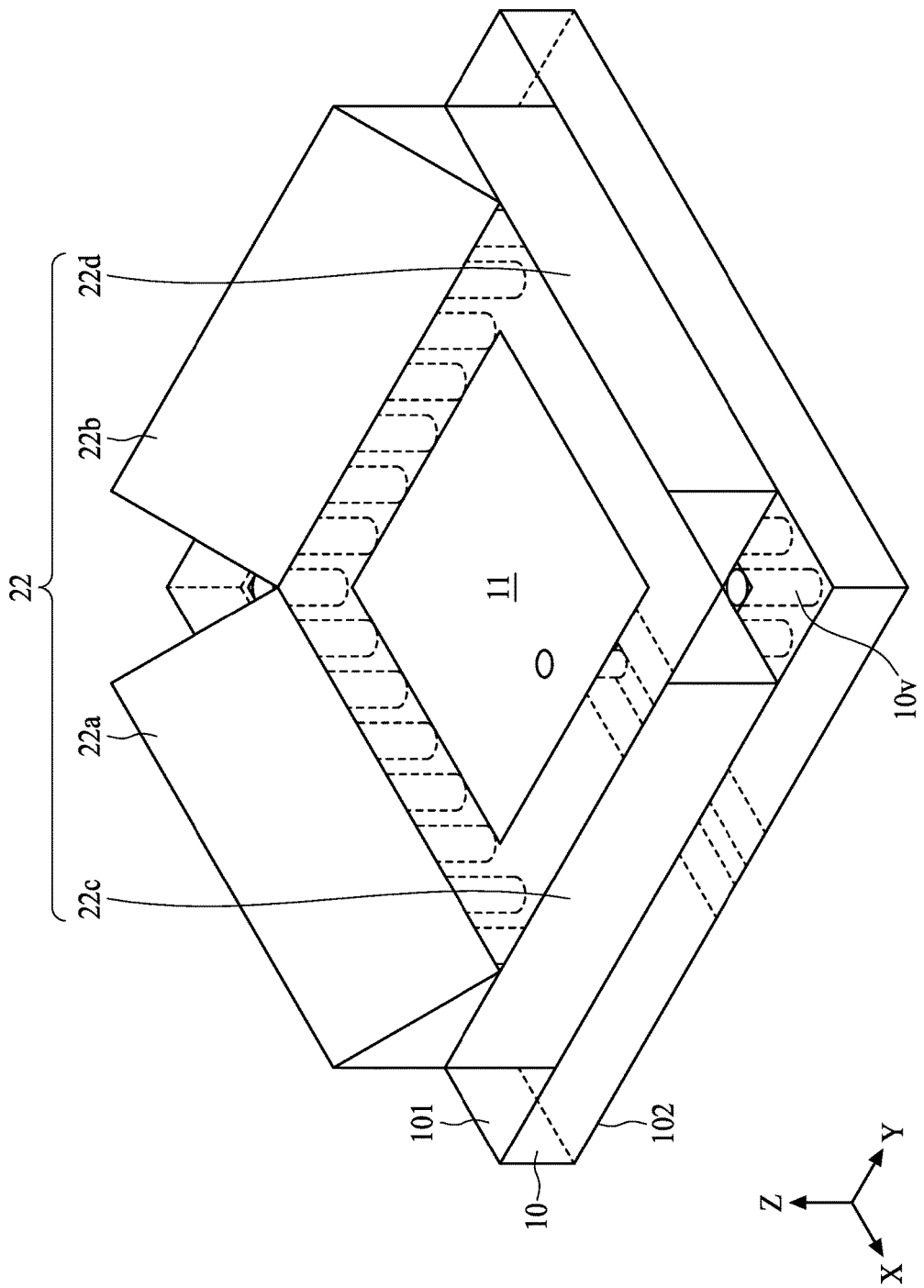
FIG. 2A illustrates a perspective view of a semiconductor package device in accordance with some embodiments of the present disclosure.

FIG. 2A illustrates a perspective view of a semiconductor package device 2 in accordance with some embodiments of the present disclosure. The semiconductor package device 2 is similar to the semiconductor package device 1 in FIG. 1A, and one of the differences therebetween is that the conductor 12 of the semiconductor package device 1 includes four sheets 12a, 12b, 12c and 12d while a conductor 22 of the semiconductor package device 2 includes four triangular prisms 22a, 22b, 22c and 22d. Although the electronic component 13 and the electrical contacts 10b as shown in FIG. 1A are not illustrated in FIG. 2A, the electronic component 13 and the electrical contacts 10b can be added to the semiconductor package device 2 (e.g., on the surface 102 of the substrate 10) according to design specifications.

The conductor 22 is disposed on the surface 101 of the substrate 10. The conductor 22 is adjacent to and disposed around the antenna 11. For example, the conductor 22 surrounds the antenna 11. For example, the conductor 22 is disposed at the periphery of the antenna 11. For example, the conductor 12 includes the four triangular prisms 22a, 22b, 22c and 22d, disposed at respective edges of the antenna 11. In some embodiments, there is gap between each two adjacent triangular prisms of the conductor 22. For example, there is a gap between the triangular prisms 22a and 22b, the triangular prisms 22b and 22d, the triangular prisms 22d and 22c or the triangular prisms 22c and 22a. In some embodiments, the gaps are located adjacent to respective corners of the antenna 11.

Figure 2B:
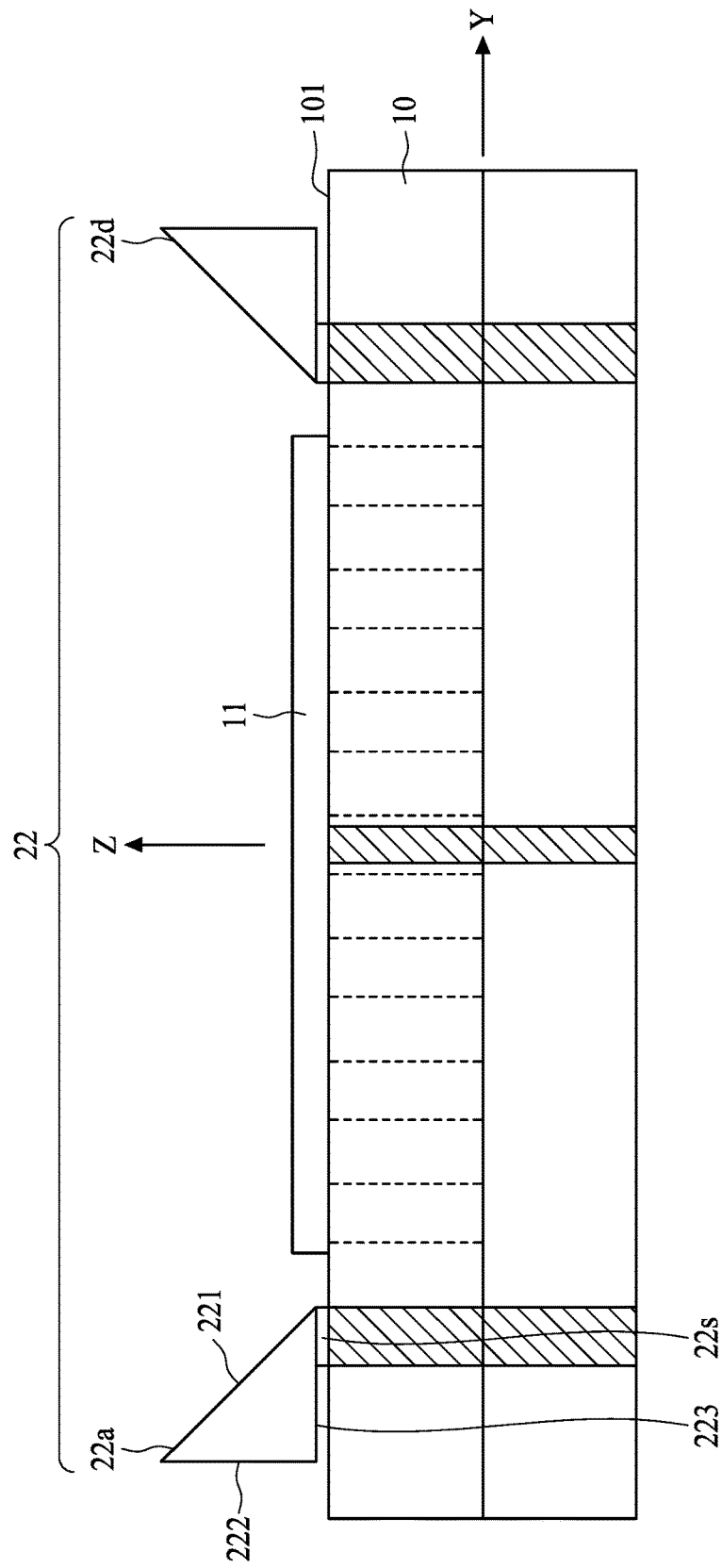
FIG. 2B illustrates a cross-sectional view of a semiconductor package device in accordance with some embodiments of the present disclosure.

As shown in FIG. 2B, which illustrates a cross-sectional view of the semiconductor package device 2 along the y-direction in FIG. 2A, each triangular prism of the conductor 22 has a surface 221 (also referred to as first surface) facing toward the antenna 11 (e.g. a surface 221 on an antenna side of the sheet of the conductor 22, which need not directly face the antenna 11), a surface 222 (also referred to as second surface) adjacent to the surface 221 and a surface 223 adjacent to the surface 221 and to the surface 222. In some embodiments, the surface 222 is substantially perpendicular to the surface 101 of the substrate 10. In some embodiments, the surface 223 is substantially parallel to the surface 101 of the substrate 10 and, for example, spaced apart from the surface 101 of the substrate 10 by a connection element 22s (e.g., a soldering layer including solder material, or an electrically conductive adhesive layer). In some embodiments, the surface 221 of the conductor 22 includes an electromagnetic-reflective surface. For example, the surface 221 can reflect one or more electromagnetic waves radiated by the antenna 11, so as to direct the electromagnetic waves in a predetermined direction (e.g., in the z-direction shown in FIG. 2A), which can increase the radiation efficiency (or the gain) of the antenna 11. In some embodiments, the surface 222 of the conductor 22 includes a thermal dissipation surface, so as to increase the heat dissipation of the semiconductor package device 2. In some embodiments, a roughness of the surface 221 is different from a roughness of the surface 222. For example, the roughness of the surface 221 is less than the roughness of the surface 222 (e.g. the roughness of the surface 221 is about 0.9 or less, about 0.8 or less, or about 0.7 or less times the roughness of the surface 222). In some embodiments, an angle defined by the surface 101 and the surface 221 can be less than 180 degrees and greater than or equal to about 90 degrees, such as less than 180 degrees and greater than or equal to about 100 degrees.

Figure 2C:
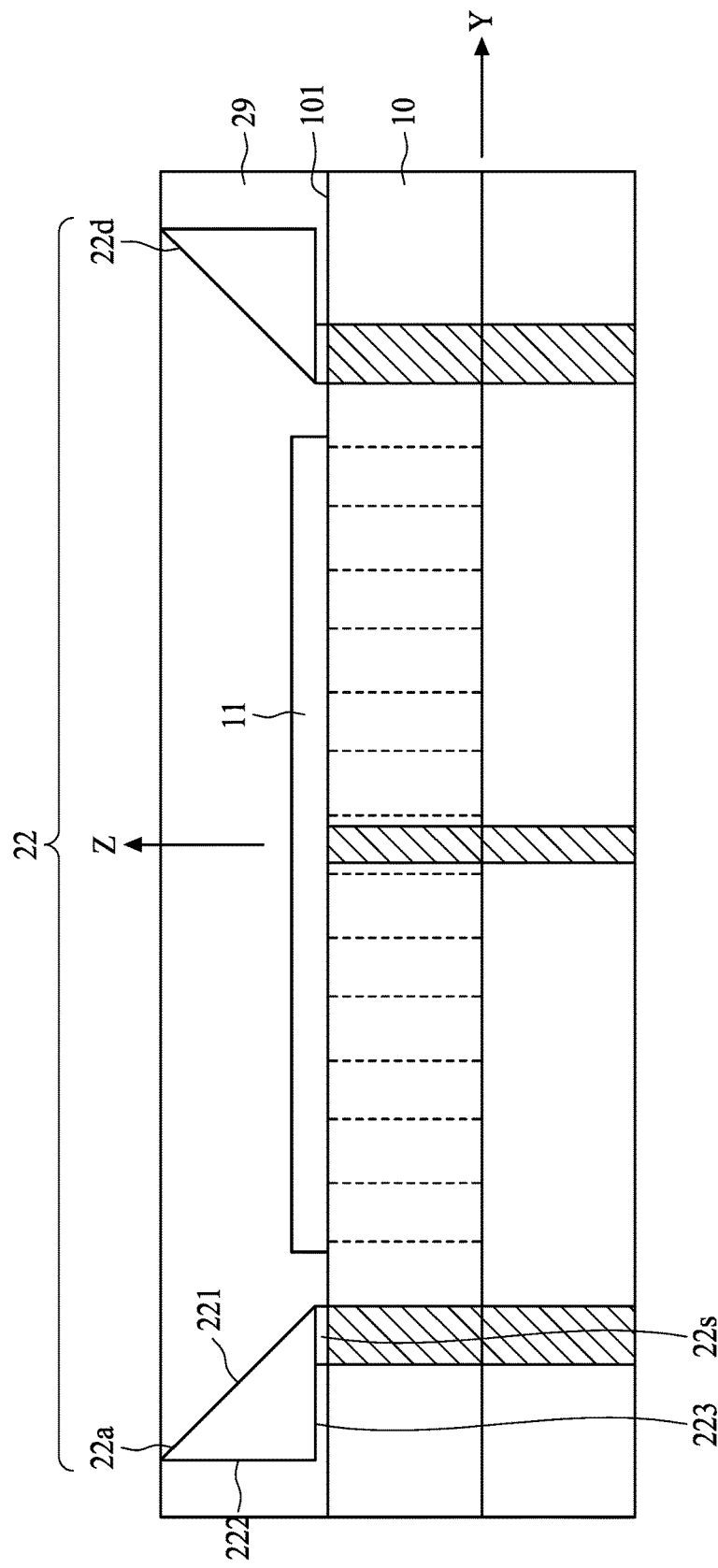
FIG. 2C illustrates a cross-sectional view of a semiconductor package device in accordance with some embodiments of the present disclosure.
Figure 2D:
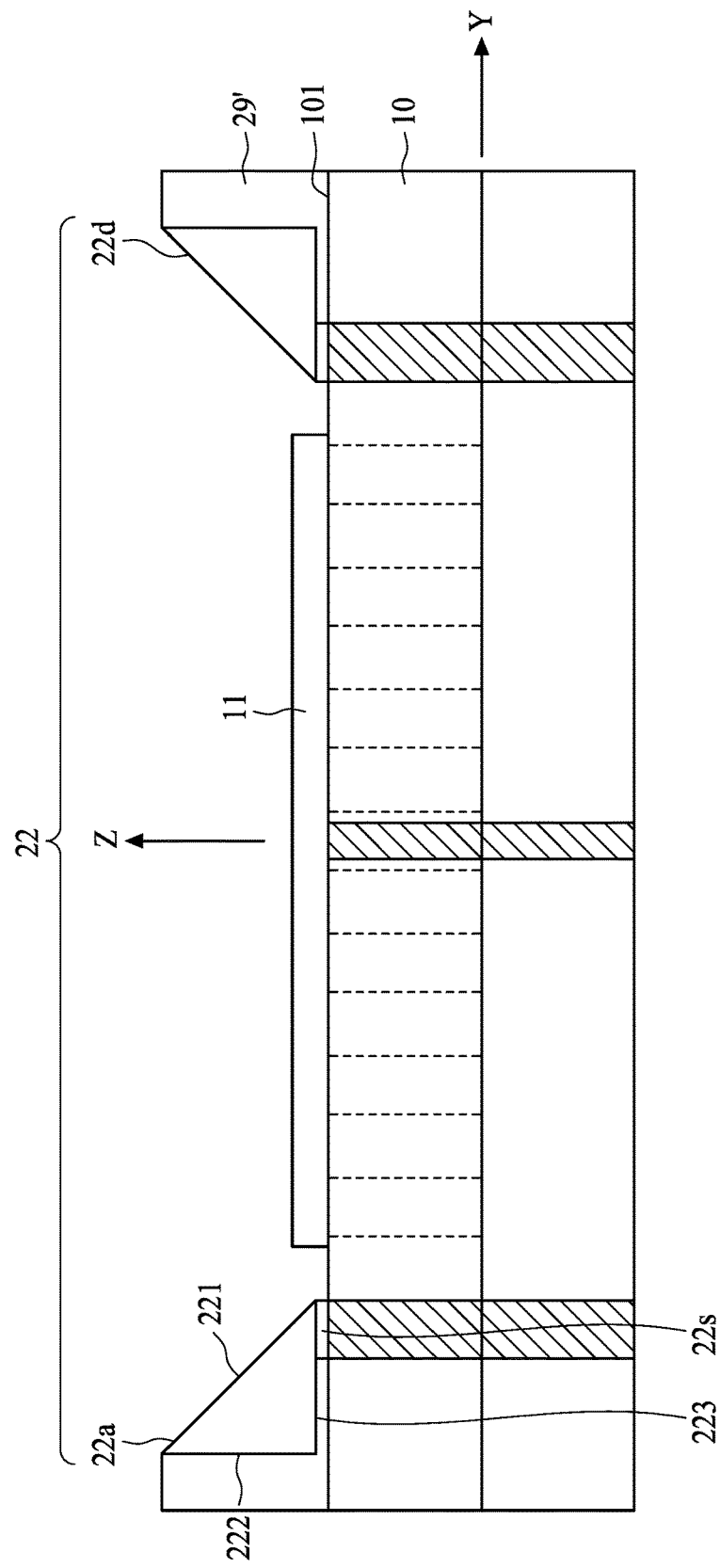
FIG. 2D illustrates a cross-sectional view of a semiconductor package device in accordance with some embodiments of the present disclosure.

In some embodiments, as shown in FIG. 2C, the semiconductor package device 2 may further include a package body 29 on the surface 101 of the substrate 10 and covering the antenna 11 and at least a portion of the conductor 22. In some embodiments, a top portion of the conductor 22 is exposed from the package body 29. In some embodiments, as shown in FIG. 2D, a package body 29' may selectively cover a portion of the conductor 22 and may expose a top portion of the conductor 22, the surface 221 of the conductor 22, and the antenna 11. In some embodiments, the package body 29 or 29' includes an epoxy resin having fillers dispersed therein.

Figure 3:
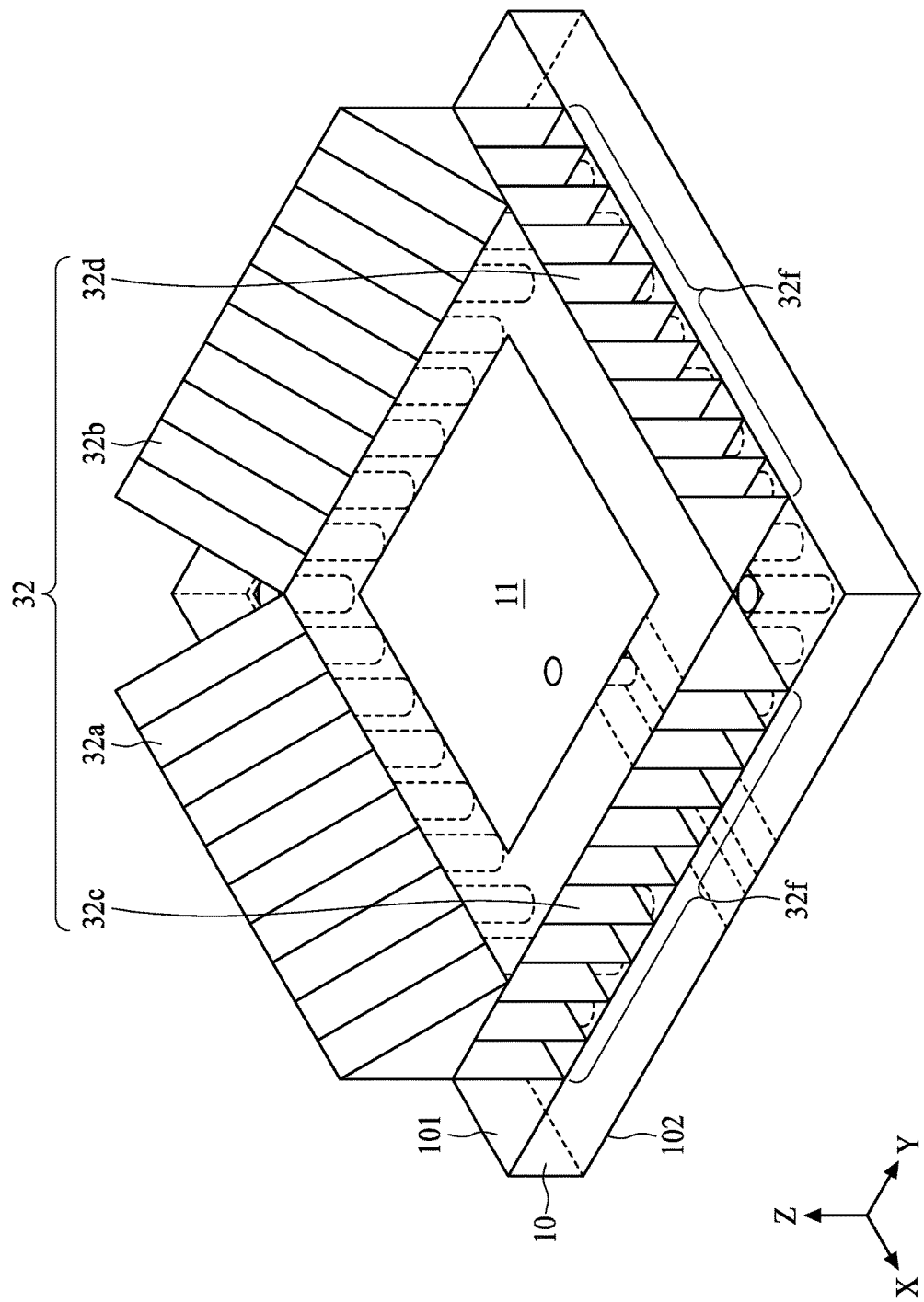
FIG. 3 illustrates a perspective view of a semiconductor package device in accordance with some embodiments of the present disclosure.

FIG. 3 illustrates a perspective view of a semiconductor package device 3 in accordance with some embodiments of the present disclosure. The semiconductor package device 3 is similar to the semiconductor package device 1 in FIG. 1A, and one of the differences therebetween is that the conductor 12 of the semiconductor package device 1 includes four sheets 12a, 12b, 12c and 12d, while a conductor 32 (including four sheets 32a, 32b, 32c and 32d) of the semiconductor package device 3 further includes a plurality of fin structures 32f adjacent to the surface 101 of the substrate 10 and the surface 122 of the conductor 12 as shown in FIG. 1A. The fin structures 32f are disposed on the surface 101 of the substrate 10 and connected to the surface 122 of the conductor 12 as shown in FIG. 1A. Compared with the conductor 12 in FIG. 1A, the fin structures 32f of the conductor 32 may further improve the heat dissipation of the semiconductor package device 3. Although the electronic component 13 and the electrical contacts 10b as shown in FIG. 1A are not illustrated in FIG. 3, the electronic component 13 and the electrical contacts 10b can be added to the semiconductor package device 3 (e.g., on the surface 102 of the substrate 10) according to design specifications.

Figure 4A:
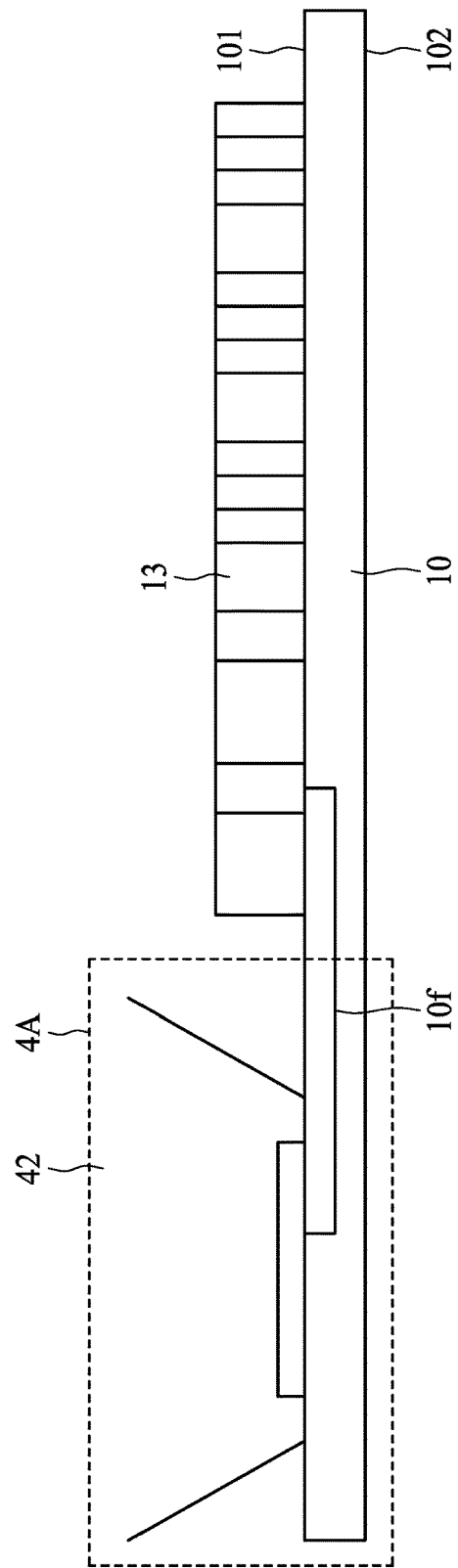
FIG. 4A illustrates a cross-sectional view of a semiconductor package device in accordance with some embodiments of the present disclosure.

FIG. 4A illustrates a cross-sectional view of a semiconductor package device 4 in accordance with some embodiments of the present disclosure. The semiconductor package device 4 is similar to the semiconductor package device 1 in FIG. 1A, and one of the differences therebetween is that in FIG. 1A, the electronic component 13 is disposed on the surface 102 of the substrate 10 while in FIG. 4, the electronic component 13 is disposed on the surface 101 of the substrate 10. The electronic component 13 is disposed adjacent to the antenna, which is disposed on the surface 101 of the substrate 10 and surrounded by a conductor 42. The electronic component 13 is separated from the antenna 11 by the conductor 42 (e.g. the conductor 42 is disposed between the electronic component 13 and the antenna 11). The electronic component 13 is electrically connected to the electronic component 13 through a feeding line 10f within the substrate 10. In some embodiments, the conductor 42 can be the same as any of the conductor 12 in FIG. 1A, the conductor 22 in FIG. 2A and the conductor 32 in FIG. 3.

Figure 4B:
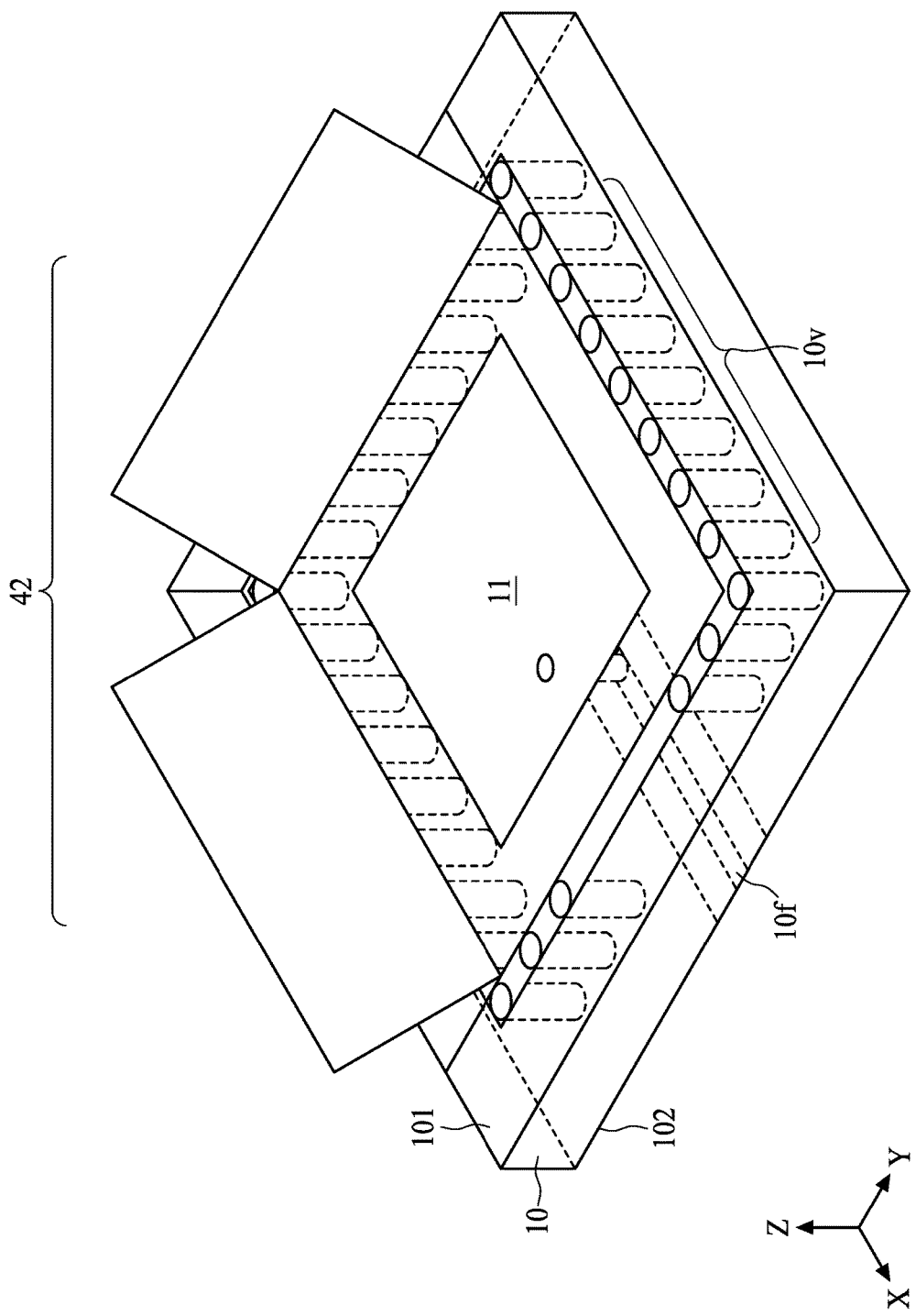
FIG. 4B illustrates a perspective view of a portion of the semiconductor package device in FIG. 4A in accordance with some embodiments of the present disclosure.
Figure 4C:
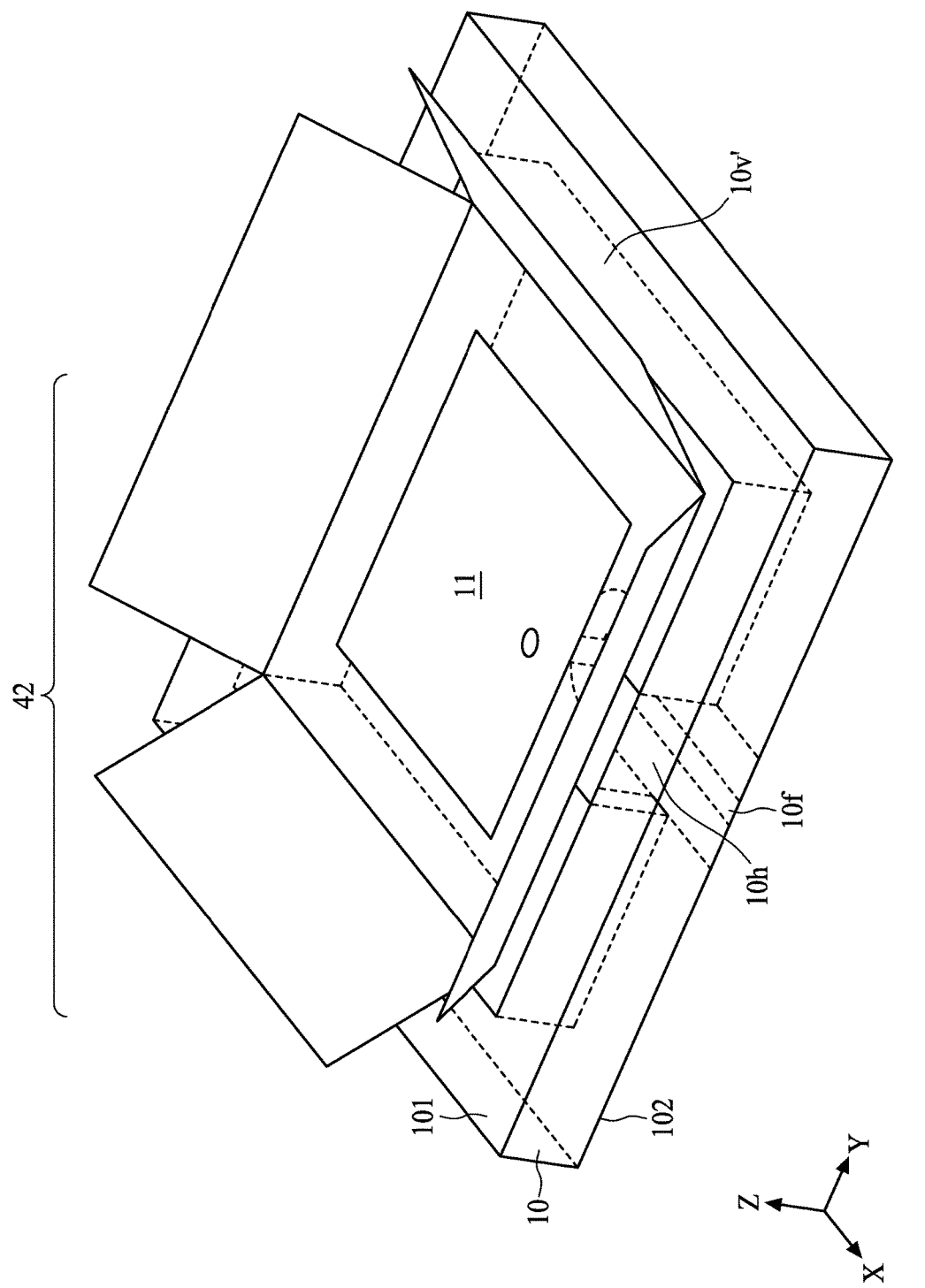
FIG. 4C illustrates a perspective view of a portion of the semiconductor package device in FIG. 4A in accordance with some embodiments of the present disclosure.

FIG. 4B illustrates a perspective view of a portion of the semiconductor package device 4 circled by a dotted-line square 4A shown in FIG. 4A in accordance with some embodiments of the present disclosure. The feeding line 10f is extended within the substrate 10 and connects the antenna 11 to the electronic component 13 as shown in FIG. 4B. In some embodiments, the interconnection structures 10v include a plurality of vias, and the feeding line 10f can connect the antenna 11 to the electronic component 13 through a gap between vias of the plurality of vias. In some embodiments, as shown in FIG. 4C, one or more interconnection structures 10v' may include a plurality of metal plates (e.g., which can function as compartment shielding) within the substrate 10. At least one of the metal plates defines an aperture 10h, so that the feeding line 10f can connect the antenna 11 to the electronic component 13 through the aperture 10h.

Figure 5A:
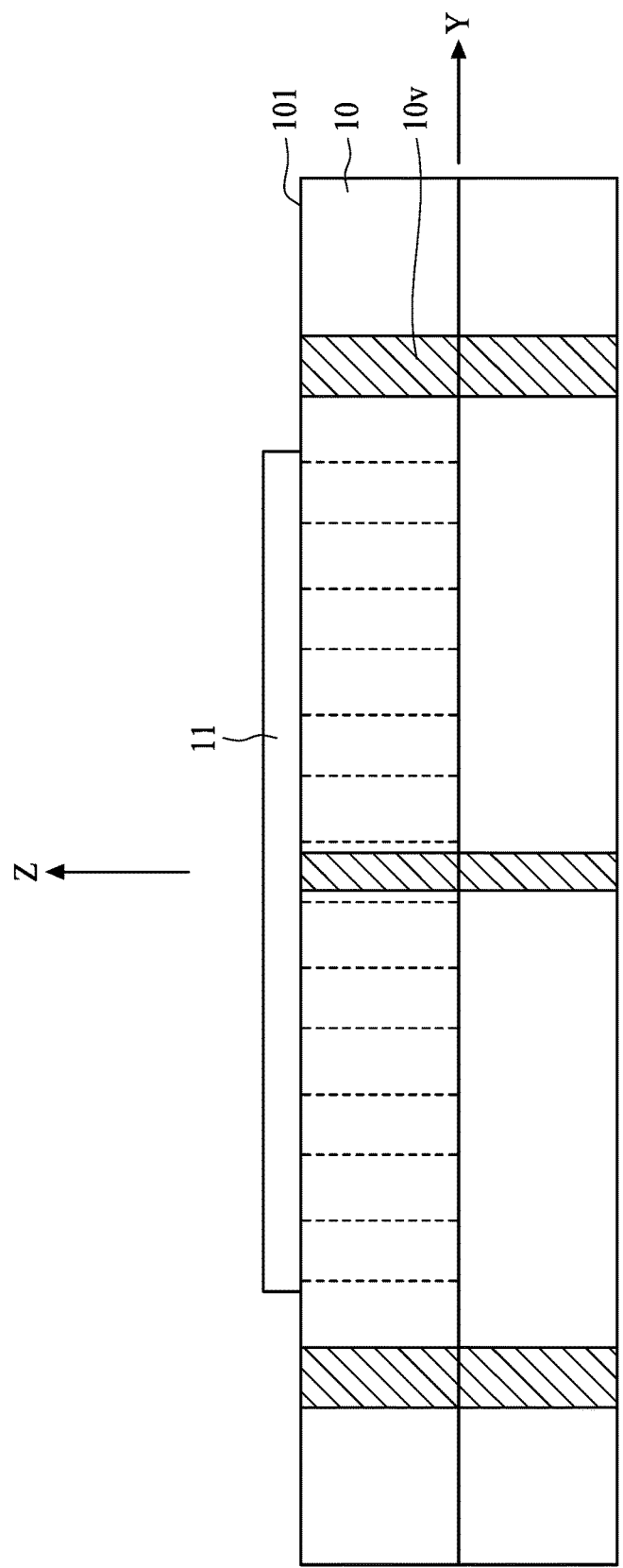
FIG. 5A, FIG. 5B and FIG. 5C illustrate a method for manufacturing a semiconductor package device in accordance with some embodiments of the present disclosure.
Figure 5B:
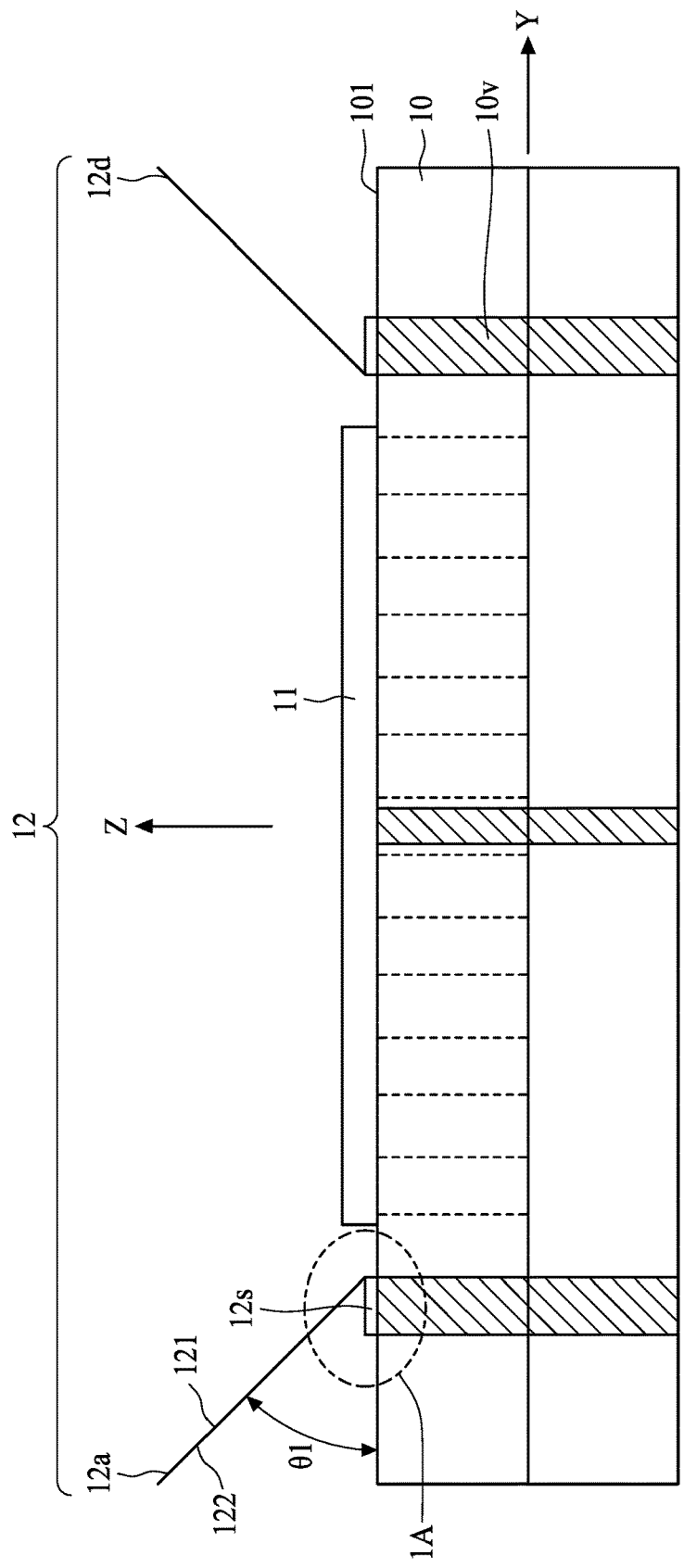
Figure 5C:
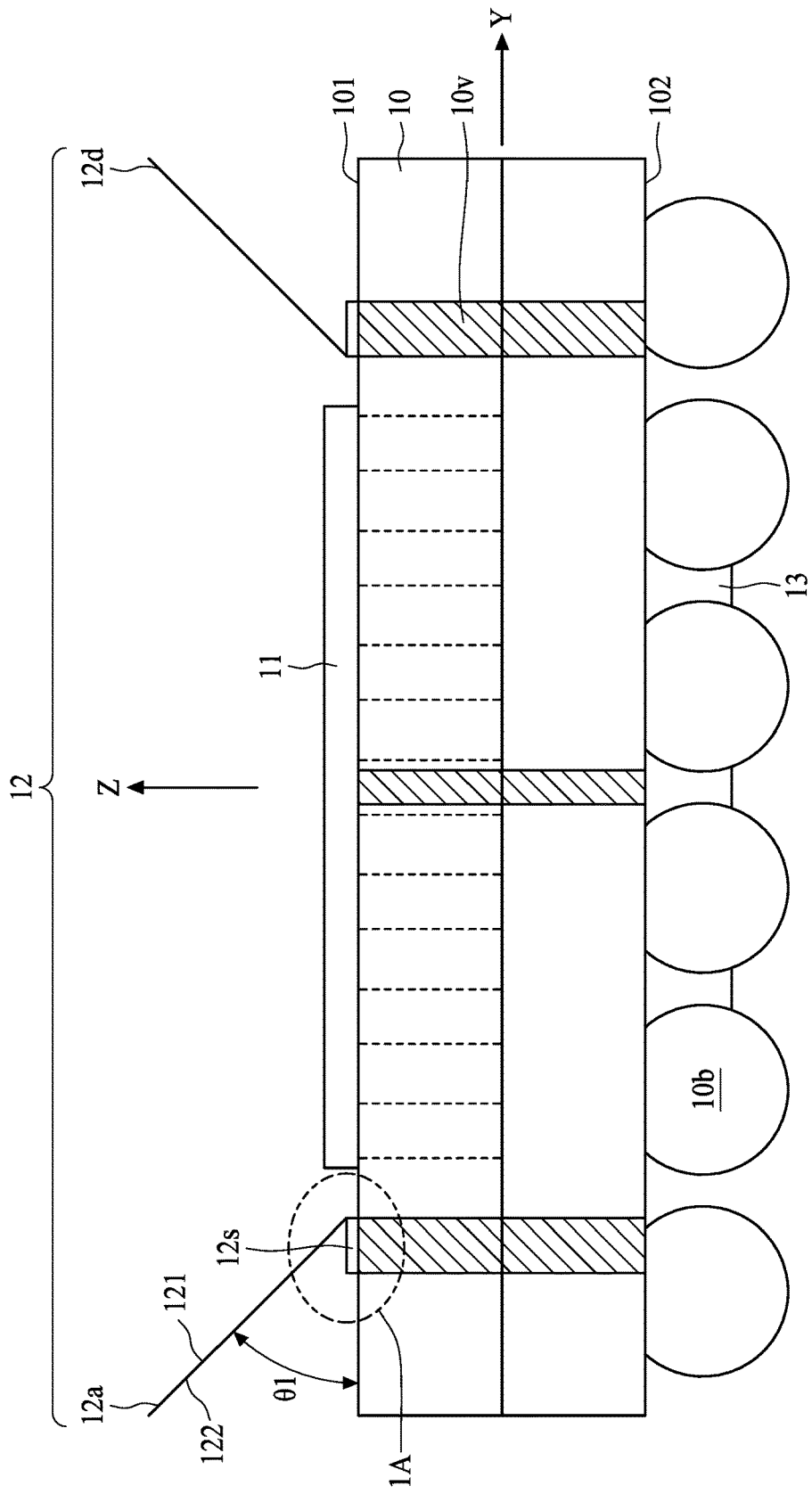

FIG. 5A, FIG. 5B and FIG. 5C illustrate a method for manufacturing the semiconductor package device 1 as shown in FIG. 1B, in accordance with some embodiments of the present disclosure. In some embodiments, the method shown in FIG. 5A, FIG. 5B and FIG. 5C can be used to manufacture other semiconductor package devices, such as semiconductor package device 2, 3 or 4 described herein.

Referring to FIG. 5A, a substrate 10 is provided, and an antenna 11 is disposed on a surface 101 of the substrate 10. In some embodiments, the substrate 10 may include a grounding element exposed from the surface 101 of the substrate 10.

Referring to FIG. 5B, a conductor 12 is disposed on the surface 101 of the substrate 10 to surround the antenna 11. For example, the conductor 12 is disposed at the periphery of the antenna 11. In some embodiments, the conductor 12 is connected to the ground element exposed from the surface 101 of the substrate 10 by a connection member 12s (e.g., including a soldering material). In some embodiments, in the operation of FIG. 5B, the conductor 12 can be replaced by any of the conductors 22 and 32 as shown in FIG. 2B and FIG. 3.

Referring to FIG. 5C, an electronic component 10b and an electronic component 13 are provided (e.g. formed or disposed) on the surface 102 of the substrate 10 to form the semiconductor package device 1 in FIG. 1B. In some embodiments, the electronic component 13 can be formed on the surface 101 of the substrate 10 to form the semiconductor package device 4 in FIG. 4A. For example, the electronic component 13 can be formed adjacent to the antenna and separated from the antenna by the conductor.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

Additionally, amounts, ratios, and other numerical values are sometimes presented herein in a range format. Such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
   a substrate having an upper surface;
   an antenna disposed on the upper surface of the substrate; and
   a conductor disposed on the upper surface of the substrate and surrounding the antenna, the conductor having a first surface facing toward the antenna and a second surface opposite to the first surface,
   wherein the second surface of the conductor is spaced apart from the upper surface of the substrate.

2. The semiconductor package device of claim 1, wherein the first surface of the conductor includes an electromagnetic-reflective surface.

3. The semiconductor package device of claim 1, wherein the second surface of the conductor includes a thermal dissipation surface.

4. The semiconductor package device of claim 1, wherein a roughness of the first surface is different from a roughness of the second surface.

5. The semiconductor package device of claim 4, wherein the roughness of the first surface is less than the roughness of the second surface.

6. The semiconductor package device of claim 1, wherein the conductor includes a plurality of fins disposed on the upper surface of the substrate and adjacent to the second surface of the conductor.

7. The semiconductor package device of claim 1, wherein the substrate has a lower surface opposite to the upper surface, and further comprises:
   a ground layer disposed between the upper surface of the substrate and the lower surface of the substrate; and
   an interconnection structure disposed within the substrate and extending from the upper surface of the substrate to at least the ground layer of the substrate.

8. The semiconductor package device of claim 7, wherein the conductor has a first terminal connected to the interconnection structure and a second terminal opposite to the first terminal.

9. The semiconductor package device of claim 7, further comprising a soldering layer connecting the conductor to the interconnection structure.

10. The semiconductor package device of claim 1, wherein an angle defined by the upper surface of the substrate and the second surface of the conductor is greater than 0 degrees and less than or equal to 90 degrees.

11. The semiconductor package device of claim 1, wherein the antenna includes a plurality of antenna elements arranged in an array.

12. The semiconductor package device of claim 1, wherein the conductor defines a gap adjacent to a corner of the antenna.

13. The semiconductor package device of claim 1, further comprising:
   an electronic component disposed on the upper surface of the substrate; and
   a feeding element disposed within the substrate and electrically connecting the electronic component to the antenna.

14. The semiconductor package device of claim 1, further comprising:
   an electronic component disposed on a lower surface of the substrate opposite to the upper surface; and
   a feeding element within the substrate and electrically connecting the electronic component to the antenna.

15. A semiconductor package device, comprising:
   a substrate having an upper surface and a lower surface opposite to the upper surface;
   an antenna disposed on the upper surface of the substrate;
   a conductor disposed on the upper surface of the substrate and surrounding the antenna; and
   a connection element disposed between the conductor and the upper surface of the substrate and connecting the conductor to the upper surface of the substrate.

16. The semiconductor package device of claim 15, wherein the connection element includes a solder material.

17. The semiconductor package device of claim 15, wherein the conductor has an electromagnetic-reflective surface.

18. The semiconductor package device of claim 17, wherein the conductor has a thermal dissipation surface opposite to the electromagnetic-reflective surface, and the thermal dissipation surface is spaced apart from the upper surface of the substrate.

19. The semiconductor package device of claim 15, wherein the substrate further comprises:
   a ground layer disposed between the upper surface of the substrate and the lower surface of the substrate; and
   an interconnection structure disposed within the substrate and extending from the upper surface of the substrate to at least the ground layer of the substrate,
   wherein the interconnection structure is in contact with the connection element.

20. A semiconductor package device, comprising:
   a substrate having an upper surface and a lower surface opposite to the upper surface;
   an antenna disposed on the upper surface of the substrate; and
   a conductive frame disposed on the upper surface of the substrate and surrounding the antenna.

21. The semiconductor package device of claim 20, further comprising a solder material disposed between the conductive frame and the upper surface of the substrate and connecting the conductive frame to the upper surface of the substrate.

22. The semiconductor package device of claim 20, wherein
   the substrate includes a grounding element exposed from the upper surface of the substrate, and
   the conductive frame has a first terminal in contact with the grounding element exposed from the upper surface of the substrate, and a second terminal opposite to the first terminal.

23. The semiconductor package device of claim 20, further comprising an electronic component disposed on the upper surface of the substrate and spaced apart from the antenna by the conductive frame.

24. The semiconductor package device of claim 20, further comprising an electronic component disposed on the lower surface of the substrate.

* * * * *